US009653225B2

(12) United States Patent
Banaszek et al.

(10) Patent No.: US 9,653,225 B2
(45) Date of Patent: May 16, 2017

(54) ELECTRICAL SWITCHING DEVICE

(71) Applicant: K.A. Schmersal Holding GmbH & Co. KG, Wuppertal (DE)

(72) Inventors: Matthias Banaszek, Wuppertal (DE); Jens Weber, Dortmund (DE)

(73) Assignee: K.A. Schmersal Holding GmbH & Co. KG, Wuppertal (DE)

( * ) Notice: Subject to any disclaimer, the term of this patent is extended or adjusted under 35 U.S.C. 154(b) by 278 days.

(21) Appl. No.: 14/361,514

(22) PCT Filed: Dec. 5, 2012

(86) PCT No.: PCT/EP2012/005006
§ 371 (c)(1),
(2) Date: Oct. 15, 2014

(87) PCT Pub. No.: WO2013/087160
PCT Pub. Date: Jun. 20, 2013

(65) Prior Publication Data
US 2015/0090567 A1 Apr. 2, 2015
US 2016/0268070 A2 Sep. 15, 2016

(30) Foreign Application Priority Data

Dec. 14, 2011 (DE) ........................ 10 2011 121 045

(51) Int. Cl.
*H05K 7/14* (2006.01)
*H01H 9/04* (2006.01)
(Continued)

(52) U.S. Cl.
CPC ............... *H01H 9/04* (2013.01); *B29C 70/70* (2013.01); *H01H 9/02* (2013.01); *H05K 5/064* (2013.01);
(Continued)

(58) Field of Classification Search
CPC ...... H01H 13/14; H01H 13/705; H05K 3/284; H05K 1/144; H05K 2203/167
(Continued)

(56) References Cited

U.S. PATENT DOCUMENTS 2,750,480 A * 6/1956 Freeman ............. H01H 9/0214
200/298
5,773,895 A * 6/1998 Hassan ................... H01L 23/13
257/692

(Continued)

FOREIGN PATENT DOCUMENTS

EP 2112872 A2 10/2009
FR 2913808 A1 9/2008

OTHER PUBLICATIONS

English translation of the International Preliminary Report on Patentability for PCT/EP2012/005006 filed on Dec. 5, 2012.

*Primary Examiner* — Renee Luebke
*Assistant Examiner* — Ahmed Saeed
(74) *Attorney, Agent, or Firm* — Kilpatrick Townsend & Stockton LLP

(57) ABSTRACT

Electronic switching device having a housing in which at least one printed circuit board with circuit parts is arranged, the housing being designed with at least one housing cover, which closes a housing opening, and with a cable bushing for a connection cable and being provided with a filling made of a plastic material which surrounds the printed circuit board with circuit parts, wherein the printed circuit board (2) is encapsulated in the housing (1) in a supported manner on a grid-like carrier body (6), to which end the grid-like carrier body (6) has individual supports (7) which span an adjustment plane (X) depending on heights (Y) of the supports (7) and on which the printed circuit board (2) can be fixed at a distance from the housing walls (8, 9, 10)

(Continued)

Figure 1:
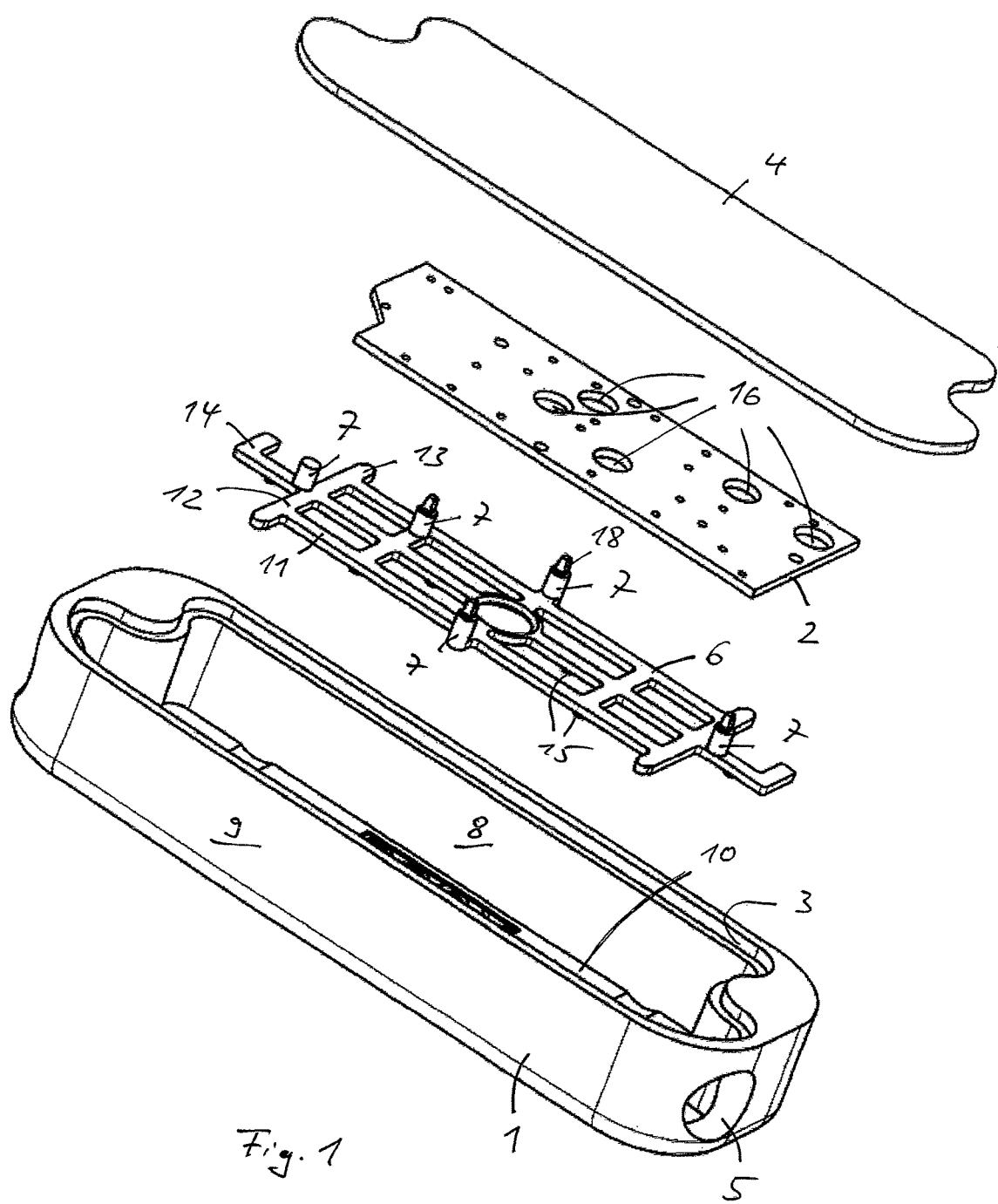

for a localized arrangement of the encapsulated circuit parts in the housing (1).

8 Claims, 2 Drawing Sheets

(51) Int. Cl.
  *H05K 5/06* (2006.01)
  *B29C 70/70* (2006.01)
  *H01H 9/02* (2006.01)
  *H01H 36/00* (2006.01)
  *G01D 11/24* (2006.01)

(52) U.S. Cl.
  CPC ........... *H05K 7/142* (2013.01); *G01D 11/245* (2013.01); *H01H 36/0006* (2013.01)

(58) Field of Classification Search
  USPC ................. 200/341–345, 292; 361/752, 753
  See application file for complete search history.

(56) References Cited

U.S. PATENT DOCUMENTS

| 7,724,540 | B1 | 5/2010 | Salinas Fox et al. | |
|---|---|---|---|---|
| 8,513,556 | B2* | 8/2013 | Kitahara | H01H 13/06 |
| | | | | 200/341 |
| 2007/0217179 | A1 | 9/2007 | Schoen et al. | |
| 2009/0272640 | A1* | 11/2009 | Villain | H01H 13/503 |
| | | | | 200/520 |
| 2010/0176534 | A1 | 7/2010 | Fornage | |
| 2010/0245004 | A1 | 9/2010 | Greenway | |
| 2010/0264005 | A1* | 10/2010 | Tsao | H01H 13/705 |
| | | | | 200/5 A |
| 2014/0008194 | A1* | 1/2014 | Yuan | H01H 13/02 |
| | | | | 200/341 |

* cited by examiner

ELECTRICAL SWITCHING DEVICE

The invention relates to an electronic switching device according to the preamble of claim 1.

DE 81 16 313 discloses a housing for electronic circuits, in particular proximity switches according to the preamble of claim 1. A plastic filling provides a sufficient degree of stability for installation. Furthermore, a good buffer effect for compensating for different coefficients of thermal expansion between the filling and enclosed or adjoining housing and circuit parts is obtained. One disadvantage is that it is difficult to adjust the circuit elements in the housing and displacement may occur owing to filling with a resin compound.

DE 42 44 994 B4 discloses an electrical switching device in which the filling is composed of a hot-melt adhesive. Hot-melt adhesives are distinguished by absolute moisture-tightness, high thermal resistance and also very good processing properties. A disadvantage in this case is that handling is difficult in respect of the correct position of the component support when filling the housing with a hot-melt adhesive.

The object of the invention is therefore to provide an electronic switching device which improves the positional accuracy of the encapsulated printed circuit board in the housing.

This object is achieved by the features of claim 1. Hereby an electronic switching device is provided in which the encapsulated printed circuit board is mechanically and electrically decoupled from the housing, but is arranged in a specific position in the housing. The electrical specifications in respect of the switching distance and, in particular, the insulation properties and also the clearance and creepage distances while maintaining the normative requirements (in this case particularly UL) can be better met. Furthermore, switching devices of this kind can be designed to meet hygiene requirements and can be better employed under general environmental influences, such as cleaning agents, UV rays, sudden warm/cold transitions, generally harsh ambient conditions, etc.

These advantages apply, in particular, when the switching device is designed as a safety magnetic switch since the reed switches which are provided in a sensor as circuit parts respond to magnetic fields of actuators in a position-dependent manner. The adjustment of the circuit elements in the housing consequently influences their response behaviour, this, however, advantageously being identical with respect to the housing in switching devices in order to avoid individual readjustment of the installation of sensors and actuators. A coding of the actuator and the associated specific arrangement of the reed contacts is necessary since the switch would otherwise not be tamper-proof and therefore could not be classified as a safety device.

The grid-like carrier body is preferably a platform for the printed circuit board, which platform compensates for pressure stresses exerted by the housing during hot-encapsulation, so that changes in the position of the printed circuit board with respect to the housing are avoided. The carrier body and the printed circuit board are preferably designed in such a way that the liquid encapsulation compound surrounds them before it cures, in order to achieve an as complete immersion of said carrier body and printed circuit board as possible. After the plastic material has cured, the carrier body, as well as the printed circuit board with the circuit parts, are preferably substantially mechanically and thermally decoupled from the housing since, owing to the plastic material flowing under the carrier body during filling, preferably only the contact to the housing via bottom-side base elements remains.

The electronic safety switch can meet protection class IP 69 K, this meaning that said electronic safety switch is resistant to high-pressure cleaning and can be employed in the typical surrounding structure of food-processing machines.

Further refinements of the invention can be found in the following description and the dependent claims.

The invention will be explained below with reference to the exemplary embodiment of the invention which is illustrated in the appended figures.

Figure 2:
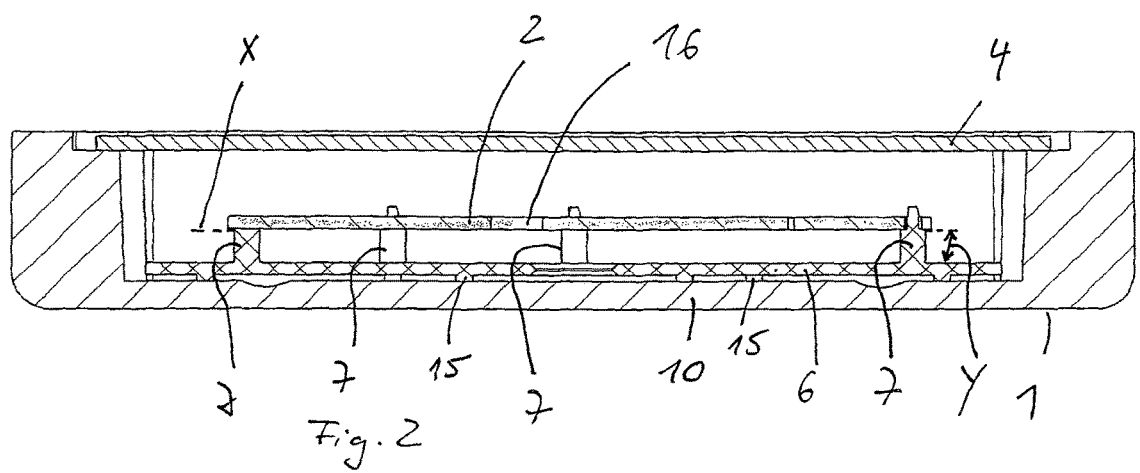

FIG. 1 schematically shows an exploded illustration of an electronic switching device without filling, FIG. 2 schematically shows a longitudinal section through FIG. 1 in the assembled state.

As shown in FIG. 1, the invention relates to an electronic switching device having a housing 1 in which at least one printed circuit board 2 with circuit parts (not illustrated) is arranged. The housing 1 is designed with at least one housing cover 4, which closes a housing opening 3, and with a cable bushing 5 for a connection cable (not illustrated). In the state in which the printed circuit board 2 is inserted into the housing 1, said housing is provided, for final assembly, with a filling made of a plastic material (not illustrated) which surrounds the printed circuit board 2 with the circuit parts.

According to the invention, the printed circuit board 2 is arranged in the housing 1 in a supported manner on a grid-like carrier body 6 for encapsulation with an encapsulation compound. To this end, the grid-like carrier body 6 has individual supports 7 which span an adjustment plane X depending on heights Y of the supports 7 and on which the printed circuit board 2 can be fixed at a distance from the housing walls 8, 9, 10 for a localized arrangement of the encapsulated circuit parts in the housing 1. Owing to the supports 7 and their preferably adjustable heights Y, the printed circuit board 2 can be arranged in an adjusted manner, in particular with respect to the housing wall 10 which forms a housing bottom in respect of the housing cover 4. The circuit parts which are mounted on the printed circuit board 2, for example reed switches, then have a defined response range with respect to the housing 1, in particular to the housing bottom 10, and/or switching distances for a contactlessly operating switch for monitoring, for example, doors and hatches.

The grid-like carrier body 6 is preferably a flat flexible structure comprising intersecting bar elements 11, 12 with thin cross sections. Bar elements 13, 14 in the form of pressure webs extend between the housing walls 8, 9 in order to position the grid-like carrier body 6 in the housing 1. The grid-like carrier body 6 further preferably has base elements 15 which arrange the carrier body 6 at a distance from the housing bottom 10 as base surface. As a result, it can be ensured that the printed circuit board 2, together with the carrier body 6, is encapsulated. The supporting function of the carrier body 6 is lost in the cured encapsulation compound since said encapsulation compound then performs the mechanical and thermal decoupling of the printed circuit board 2, together with circuit parts, from the housing 1. Therefore, there are no fixings for the printed circuit board on the housing 1 since the carrier body 6, which is provided for positioning/adjusting the printed circuit board 2, is encapsulated by the encapsulation compound by melting.

Therefore, capillary channels to the printed circuit board 2 are avoided since the encapsulation compound reaches up to the housing walls 8, 9, 10.

The printed circuit board 2 preferably has openings 16 for plastic material of the filling to pass through during encapsulation of the housing 1. The printed circuit board 2 can further preferably be fixed to the supports 7 by means of press-fit pins 18.

According to an embodiment which is not illustrated, at least one light source, for example a light-emitting diode, can be mounted on the printed circuit board 2, which indicates a switching state and is able to perform an indication to the outside via a transparent or open housing section.

The housing 1 is preferably made of metal, in order to satisfy, for example, the hygiene requirements in food-processing machine construction. If the housing 1 is produced from stainless steel, resistance to corrosion and cleaning liquids is given. The housing 1 then further preferably has a slim design with a precision-ground surface. The precision-ground surface is primarily due to the requirements for structures of hygienic design. For the structure of hygienic design care should be taken, amongst other things, that there are no rough surfaces, beads or edges since dirt could collect here and, as a result, the switch would be difficult to clean.

Sealing by means of the plastic material is achieved by using an encapsulation compound. An encapsulation compound which can be used, for example, is Macromelt from Henkel. In this case, the processing temperatures of the encapsulation compound are, for example, below 200° C.

Various encapsulation materials can be used as insulating and sealing means. However, the material must be as fluid as possible during encapsulation, so that it can be filled in the free spaces left by the printed circuit board 2 and the carrier body 6. Apart from that, the material should still be elastic enough in the cured state that the sealing function is promoted. In addition, on account of the elasticity of the compound, it can be ensured that vibrations which act on the housing are absorbed.

The housing cover 4 can be fitted during or after the encapsulation compound or the filling has cured. Mounting of the cover after the encapsulation compound has cured can comprise the following steps: applying adhesive to the edge of the housing 1 which is intended for this purpose, and inserting the housing cover 4 into a housing cutout which is intended for it.

The invention claimed is:

1. Electronic switching device having a housing in which at least one printed circuit board with circuit parts is arranged, the housing being designed with at least one housing cover, which closes a housing opening, and with a cable bushing for a connection cable and being provided with a filling made of plastic material which surrounds the printed circuit board with the circuit parts, wherein the printed circuit board is encapsulated in the housing in an elevated and supported manner on a grid-like carrier body, wherein a surface of the grid-like carrier body proximate the printed circuit board has individual supports being local pin-shaped elevations extending therefrom, the supports spanning an adjustment plane (X) depending on heights (Y) of the supports and supporting the printed circuit board at a distance from housing walls of the housing for a localized arrangement of the encapsulated circuit parts in the housing.

2. Electronic switching device according to claim 1, wherein the grid-like carrier body is a flat flexible structure comprising intersecting bar elements with thin cross sections.

3. Electronic switching device according to claim 2, wherein bar elements extend between the housing walls as pressure webs for positioning the grid-like carrier body in the housing.

4. Electronic switching device according to claim 1, wherein the grid-like carrier body has base elements which arrange the carrier body at a distance from a housing bottom as base surface.

5. Electronic switching device according to claim 1, wherein the printed circuit board has openings for the plastic material of the filling to pass through before curing.

6. Electronic switching device according to claim 4, wherein:
   the housing bottom, housing walls, and at least one housing cover completely encapsulate the printed circuit board and the grid-like carrier body; and
   the base elements extend from a surface of the grid-like carrier body opposite the individual supports and contact the housing bottom to arrange the grid-like carrier body at the distance from the housing bottom.

7. Electronic switching device according to claim 1, wherein the heights (Y) of the supports are adjustable.

8. An electronic switching device comprising:
   a housing comprising at least one side wall and a housing bottom that form a closed-bottom receptacle;
   a grid-like carrier body disposed within the closed-bottom receptacle and against the housing bottom, the carrier body comprising a plurality of pin-shaped protrusions extending away from the housing bottom;
   at least one printed circuit board positioned atop the plurality of protrusions such that the at least one printed circuit board is disposed at a distance from the housing bottom;
   a housing cover seated against at least one side wall of the housing, thereby sealing the housing; and
   an encapsulation filling made of plastic material which surrounds the printed circuit board within the sealed housing.

\* \* \* \* \*